US012689366B2

(12) United States Patent
Chien et al.

(10) Patent No.: US 12,689,366 B2
(45) Date of Patent: Jul. 21, 2026

(54) CONTROL DEVICE OF POWER SWITCH

(71) Applicant: Excelliance MOS Corporation, Hsinchu County (TW)

(72) Inventors: Ming-Hung Chien, Hsinchu County (TW); Tsai Wei Tsai, Hsinchu County (TW)

(73) Assignee: Excelliance MOS Corporation, Hsinchu County (TW)

( * ) Notice: Subject to any disclaimer, the term of this patent is extended or adjusted under 35 U.S.C. 154(b) by 50 days.

(21) Appl. No.: 18/935,676

(22) Filed: Nov. 4, 2024

(65) Prior Publication Data

US 2026/0081597 A1 Mar. 19, 2026

(30) Foreign Application Priority Data

Sep. 16, 2024 (TW) ................................. 113135133

(51) Int. Cl.
H03K 17/16 (2006.01)
H03K 17/30 (2006.01)
H03K 17/687 (2006.01)

(52) U.S. Cl.
CPC ........... H03K 17/166 (2013.01); H03K 17/30 (2013.01); H03K 17/687 (2013.01)

(58) Field of Classification Search
CPC .... H03K 17/166; H03K 17/30; H03K 17/687; H03K 17/163

USPC .......................................................... 327/100
See application file for complete search history.

(56) References Cited

U.S. PATENT DOCUMENTS

| | | | |
|---|---|---|---|
| 6,407,594 B1 * | 6/2002 | Milazzo ............. | H03K 17/6877 |
| | | | 327/377 |
| 8,519,773 B2 * | 8/2013 | Watanabe ........ | H03K 17/04123 |
| | | | 327/434 |
| 11,258,438 B1 * | 2/2022 | Chien ........................ | G05F 3/26 |
| 2017/0237421 A1 * | 8/2017 | Cui .................. | H03K 17/04106 |
| | | | 327/377 |
| 2024/0128852 A1 | 4/2024 | D'Souza et al. | |

* cited by examiner

*Primary Examiner* — Regis J Betsch
*Assistant Examiner* — Amit R Bhatia
(74) *Attorney, Agent, or Firm* — JCIPRNET

(57) ABSTRACT

A control device of a power switch includes a discharge current generator. The discharge current generator is coupled between a control end of the power switch and a reference voltage. In a time period when the power switch is turned off, the discharge current generator combines a first current and a second current in a first sub-time period to generate a third current and sets the control end of the power switch to be discharged according to the third current. The discharge current generator merely provides the second current in a second sub-time period and sets the control end of the power switch to be discharged according to the second current. The third current is greater than the second current. The first current decreases with time in the first sub-time period. The second current is a constant current.

14 Claims, 7 Drawing Sheets

400

100

300

500

CONTROL DEVICE OF POWER SWITCH

CROSS-REFERENCE TO RELATED APPLICATION

This application claims the priority benefit of Taiwan application serial no. 113135133, filed on Sep. 16, 2024. The entirety of the above-mentioned patent application is hereby incorporated by reference herein and made a part of this specification.

BACKGROUND

Technical Field

The disclosure relates to a control device of a power switch, and in particular, relates to a control device of a power switch capable of preventing generation of voltage spikes by an input voltage when the power switch is turned off.

Description of Related Art

In electronic devices, power switches are installed most of the time to control the voltage supply operation. Due to the presence of stray inductance in the circuit loop, rapidly turning off a power switch under conditions of large output and input currents may generate a large and instantaneous current change in the circuit loop. This instantaneous current change may cause the phenomenon of input voltage spikes to appear in the input voltage. Further, this voltage spike phenomenon may lead to damage of peripheral passive components or power components and may also generate unnecessary electromagnetic interference, and the normal operation of the electronic device is thus affected.

SUMMARY

The disclosure provides a control device of a power switch configured to decrease generation of voltage spikes by an input voltage during a procedure of turning off the power switch.

The disclosure provides a control device of a power switch, and the control device includes a discharge current generator. The discharge current generator is coupled between a control end of the power switch and a reference voltage. In a time period when the power switch is turned off, the discharge current generator combines a first current and a second current in a first sub-time period to generate a third current and sets the control end of the power switch to be discharged according to the third current. The discharge current generator merely provides the second current in a second sub-time period and sets the control end of the power switch to be discharged according to the second current. The third current is greater than the second current. The first current decreases with time in the first sub-time period. The second current is a constant current.

To sum up, in the disclosure, the control device of the power switch provides the hybrid third current (a combination of the first current and the second current) in the first sub-time period during the procedure of turning off the power switch to discharge the control end of the power switch, so that the power switch may quickly enter the off state. Further, in the second sub-time period following the first sub-time period, only the constant second current is provided to discharge the control end of the power switch, so that the control voltage of the power switch decreases slowly in the second time period. In this way, under the soft start control mechanism, the control device of the power switch can take into account the turn-off rate of the power switch, and the working efficiency of the power switch is effectively improved.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
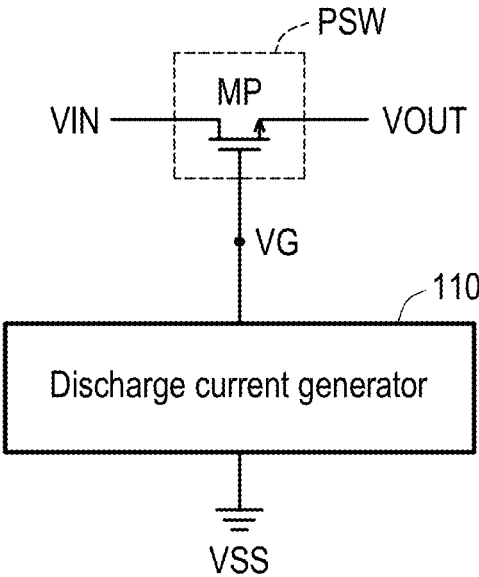
FIG. 1 is a schematic diagram illustrating a control device of a power switch according to an embodiment of the disclosure.

With reference to FIG. 1, FIG. 1 is a schematic diagram illustrating a control device of a power switch according to an embodiment of the disclosure. A control device 100 is coupled to a control end of a power switch PSW to control a control voltage VG on the control end of the power switch PSW and adjusts the control voltage VG to turn on or turn off the power switch PSW. In this embodiment, the power switch PSW is constructed by a transistor MP. The transistor MP may be an N-type transistor, and first end (e.g., a source) thereof may receive an input voltage VIN. A second end (e.g., a drain) of the transistor MP may generate an output voltage VOUT. A control end (e.g., a gate) of the transistor MP may receive the control voltage VG.

The control device 100 includes a discharge current generator 110. The discharge current generator 110 is coupled between the control end of the power switch PSW and a reference voltage VSS. In a time period when the control device 100 executes a turn-off procedure of the power switch PSW, the control device 100 may simultaneously provide a first current and a second current in a first sub-time period, generate a third current by combining the first current and the second current, and discharge the control end of the power switch PSW using the third current. The third current is greater than the second current. A current flow direction of the third current is from the control end of the power switch PSW towards the reference voltage VSS, and in this embodiment, the reference voltage VSS may be a reference ground voltage.

By discharging the control end of the power switch PSW using the third current, the discharge current generator 110 may, in the first sub-time period, cause the control voltage VG to decrease rapidly, thereby enabling the transistor MP to enter a cut-off state within the first sub-time period.

It is worth noting that the first current provided by the control device 100 may be a ramp current that decreases with time, while the second current provided by the control device 100 may be a constant current. Taking the linear decrease of the first current in the first sub-time period as an example, the control voltage VG may also correspondingly decrease linearly in the first sub-time period.

Next, in the second time period following the first time period, the control device 100 may change to provide only the second current and discharge the control end of the power switch PSW using the second current. In this way, in the second time period, the control voltage VG may decrease slowly, so that generation of a voltage spike on the input voltage VIN is effectively decreased.

According to the above, in the disclosure, the control device 100 provides the discharge current generator 110 and sets the discharge current generator 110 to discharge the control end of the power switch PSW using the third current, which is a ramp current, in the first sub-time period, so that the control voltage VG is accordingly reduced and the transistor MP is set to quickly enter a cut-off region. The discharge current generator 110 also provides the constant second current to discharge the control end of the power switch PSW in the second sub-time period and causes the control voltage VG to decrease slowly, so that the stability of the input voltage VIN is controlled.

Figure 2A:
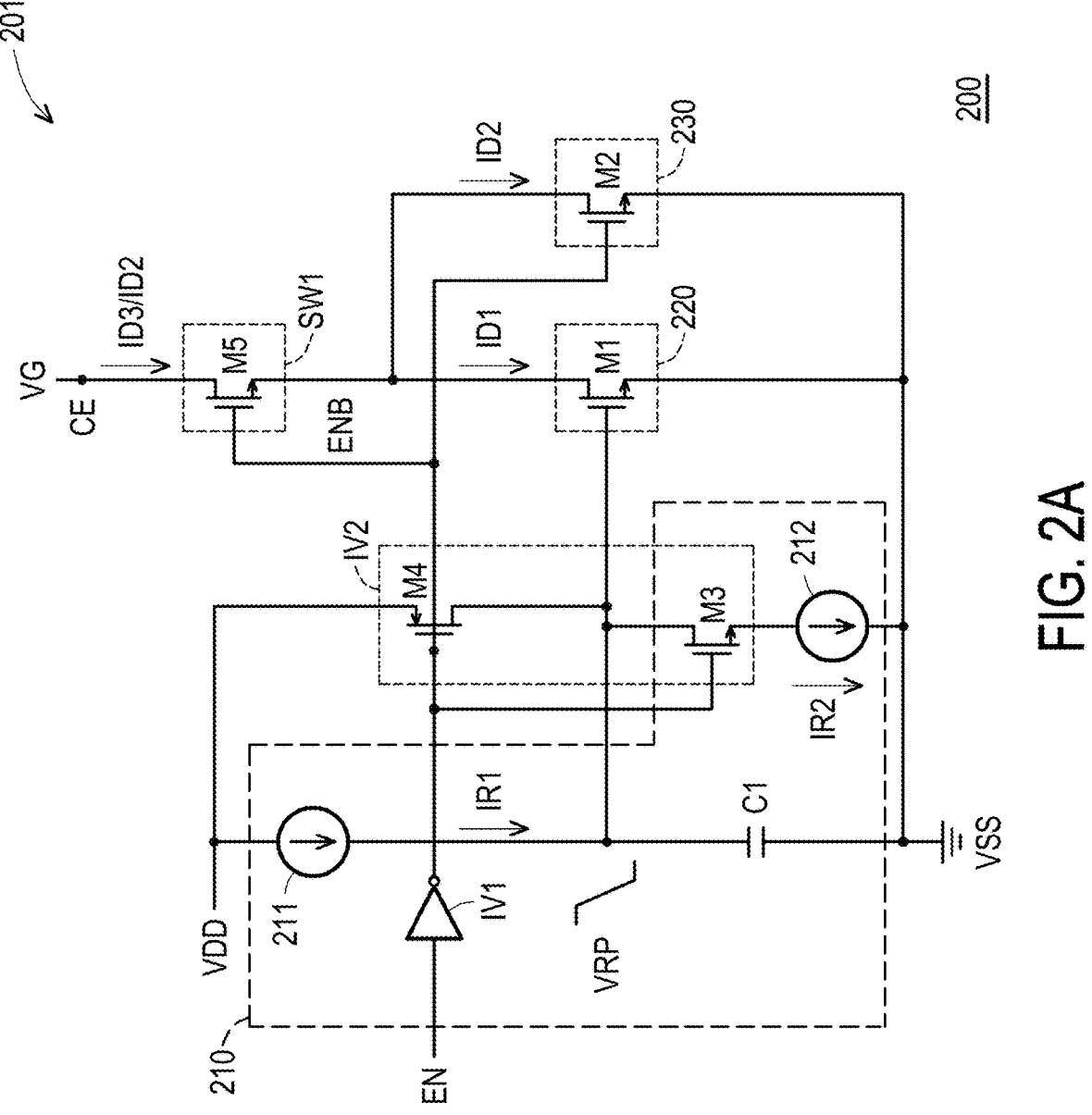
FIG. 2A is a circuit schematic diagram illustrating a control device of the power switch according to another embodiment of the disclosure.

With reference to FIG. 2A, FIG. 2A is a circuit schematic diagram illustrating a control device of the power switch according to another embodiment of the disclosure. A control device 200 includes a discharge current generator 201. The discharge current generator 201 is coupled to a control end CE of the power switch and is used to adjust the control voltage VG. The discharge current generator 201 includes a ramp voltage generator 210 and current sources 220 and 230. The ramp voltage generator 210 is used to generate a ramp voltage VRP in a first sub-time period based on an enable signal EN. The current source 220 is coupled to the ramp voltage generator 210 and the control end CE of the power switch and provides a first current ID1 in the first sub-time period according to the ramp voltage VRP. The current source 230 is coupled to the control end CE of the power switch and generates a second current ID2 in the first sub-time period and the second sub-time period according to the enable signal EN. In this embodiment, the current sources 220 and 230 are coupled to a switch SW1 together and are coupled to the control end CE of the power switch through the switch SW1. The switch SW1 may be constructed by a transistor M5, which is controlled by an inverted enable signal ENB and is turned on when the enable signal EN is at logic value 0 (inverted enable signal ENB is at logic value 1). Conversely, when the enable signal EN is at logic value 1 (inverted enable signal ENB is at logic value 0), the switch SW1 is turned off.

In this embodiment, the current source 220 is constructed by a transistor M1, while the current source 230 is constructed by a transistor M2. The transistors M1 and M2 are connected in parallel between the switch SW1 and the reference voltage VSS. In the first sub-time period, the current sources 220 and 230 provide a third current ID3

(equal to a sum of the first current ID1 and the second current ID2) together to the control end CE. In the second sub-time period, only the current source 230 provides the second current ID2 to the control end CE.

The ramp voltage generator 210 includes a current source 211, a capacitor C1, a transistor M3, and a current source 212. The current source 211 and the capacitor C1 are connected in series. The current source 211 may provide a reference current IR1 to the capacitor C1 based on a power voltage VDD and is used to charge the capacitor C1. The transistor M3 is coupled between the current source 212 and a mutually coupled end point of the capacitor C1 and the current source 211. The transistor M3 acts as a switch and may be turned on or off according to the inverted enable signal ENB. The current source 212 is coupled between transistor M3 and the reference voltage VSS.

Figure 2B:
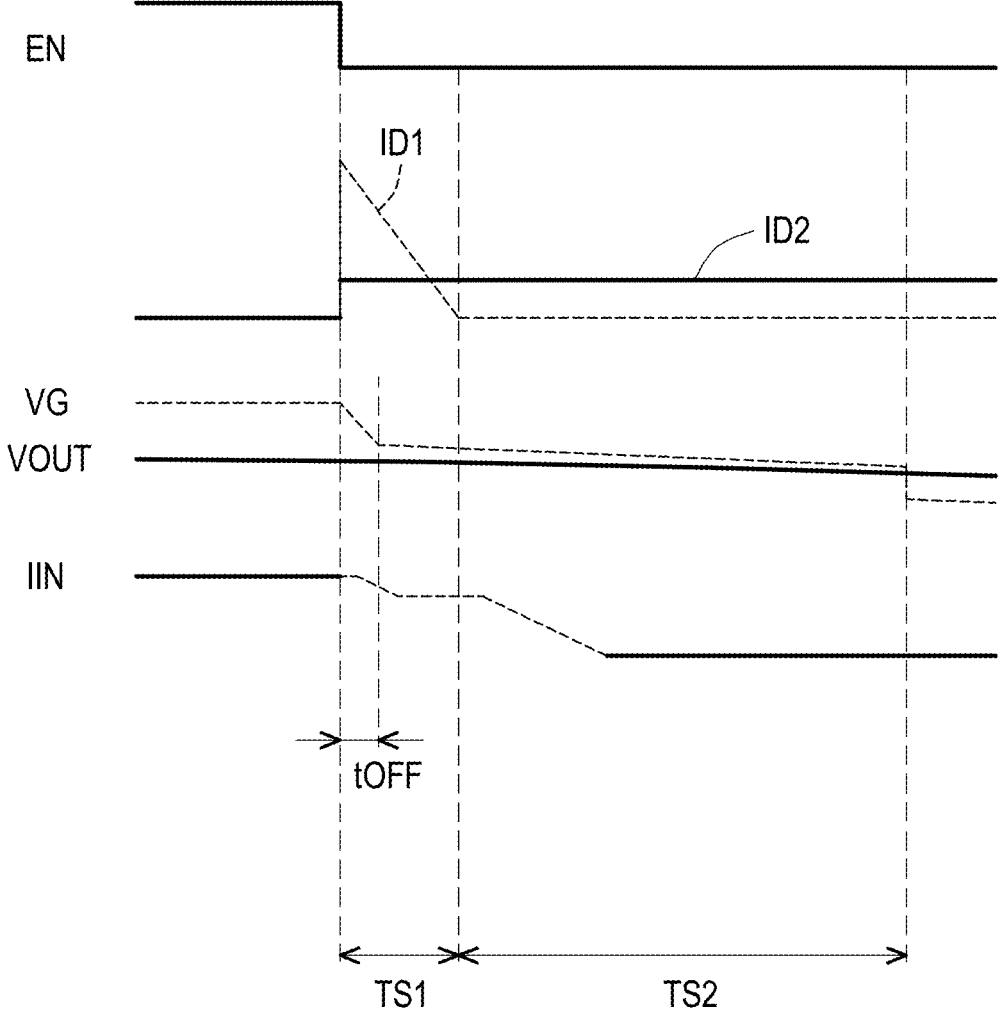
FIG. 2B is an operation waveform diagram illustrating a control device 200 according to the embodiment of FIG. 2A of the disclosure.

With reference to FIG. 2A and FIG. 2B together, FIG. 2B is an operation waveform diagram illustrating the control device 200 according to the embodiment of FIG. 2A of the disclosure. In an initial state when the control device 200 executes a turn-off procedure of the power switch, the ramp voltage VRP provided at the mutually coupled end point of the current source 211 and the capacitor C1 is at a relatively high voltage value. When the turn-off procedure of the power switch is initiated, the enable signal EN transitions to a logic value of 0 and may enter a first sub-time period TS1. In the first sub-time period TS1, the transistor M3 is turned on according to the inverted enable signal ENB, which has a logic value of 1. Herein, the capacitor C1 is coupled to the current source 212 through the transistor M3. The current source 212 then discharges the capacitor C1 through a reference current IR2 it provides. As a result, the ramp voltage VRP may decrease linearly. It is worth noting that when the enable signal EN transitions to a logic value of 1, the current source 211 may be turned off to stop providing the reference current IR1.

In the first sub-time period TS1, the current source 220 generates the first current ID1 according to the ramp voltage VRP. As the ramp voltage VRP decreases with time in the first sub-time period TS1, the first current ID1 generated by the current source 220 is a ramp current that decreases with time during the first sub-time period TS1. On the other hand, the current source 230 may generate the second current ID2 in the first sub-time period TS1 according to the inverted enable signal ENB, which has a logic value of 1. Since the inverted enable signal ENB has a constant voltage value, the current source 230 may generate the second current ID2 as a constant current in the first sub-time period TS1.

In the first sub-time period TS1, the switch SW1 may be turned on according to the inverted enable signal ENB. Therefore, the discharge current generator 201 may combine the first current ID1 and the second current ID2, draw a third current (equal to the sum of the first current ID1 and the second current ID2) from the control end CE of the power switch, and set the control end CE of the power switch to be discharged according to the third current, so that a voltage value of the control voltage VG is decreased.

In this embodiment, when the control voltage VG is pulled down to equal a sum of the output voltage VOUT and a threshold voltage of a power transistor of the power switch, the power switch may be correspondingly turned off. Based on the control voltage VG, in the first sub-time period TS1, turn-off time tOFF of the power switch may be effectively reduced due to the rapid decrease of the first current ID1, which is a ramp current.

Next, in the second sub-time period TS2, as the ramp voltage VRP has approached the reference voltage VSS, the current source 220 may stop generating the first current ID1. At this time, the discharge current generator 201 merely provides the second current ID2 through the current source 230 and sets the control end CE of the power switch to be discharged only according to the second current ID2. Under these conditions, the control voltage VG decreases slowly. A current IIN at an input end of the power switch may gradually decrease as the control voltage VG decreases, without generating the phenomenon of current surge. Under the premise of not generating the phenomenon of current surge, the input voltage of the power switch also may not generate a voltage spike.

After the second sub-time period TS2, the control voltage VG may be directly pulled down to equal the reference voltage VSS.

It is worth mentioning that in FIG. 2A, transistors M4 and M3 may construct an inverter. An inverter IV1 is used to receive the enable signal EN and generate the inverted enable signal ENB. The inverter constructed by the transistors M4 and M3 may receive the inverted enable signal ENB, generate an output signal that has a time delay but has a same phase as the enable signal EN, and output this output signal to the control end of the current source 220.

In this embodiment, a capacitance value of the capacitor C1 and a current value of the reference current IR2 provided by the current source 212 may determine a slope of the ramp voltage VRP when it decreases.

Figure 3:
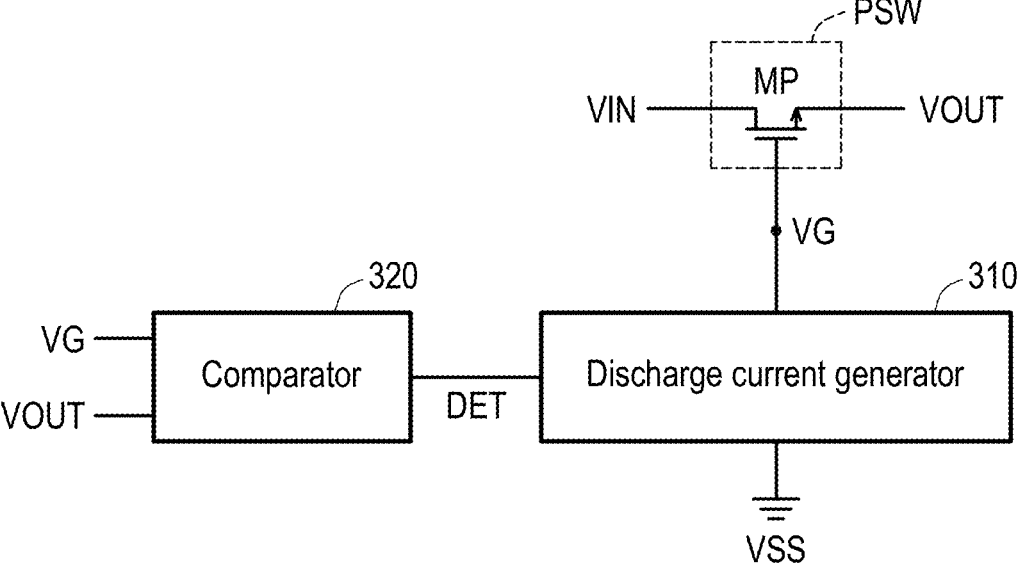
FIG. 3 is a schematic diagram illustrating a control device of the power switch according to an embodiment of the disclosure.

With reference to FIG. 3, FIG. 3 is a schematic diagram illustrating a control device of the power switch according to an embodiment of the disclosure. A control device 300 is coupled to the control end of the power switch PSW to control the control voltage VG on the control end of the power switch PSW and adjusts the control voltage VG to turn on or turn off the power switch PSW. The control device 300 includes a discharge current generator 310 and a comparator 320. The discharge current generator 310 and the comparator 320 are coupled to each other.

In this embodiment, the discharge current generator 310 is similar to the discharge current generator 210 in the embodiment of FIG. 1. The comparator 320 is configured to compare the control voltage VG on the control end of the power switch with the output voltage VOUT of the power switch to generate a detection signal DET. When the voltage value of the control voltage VG is less than a sum of voltage values of the output voltage VOUT and a bias voltage, the comparator 320 uses the generated detection signal DET to control the discharge current generator 310 to start gradually decreasing the voltage value of the generated ramp voltage at a specific time point. Further, in this embodiment, the ramp voltage provided by the discharge current generator 310 does not gradually decrease with time at the beginning of the first sub-time period. According to the detection signal DET, the discharge current generator 310 only starts to decrease the voltage value of the ramp voltage when the voltage value of the control voltage VG decreases to less than the sum of the output voltage VOUT and the bias voltage. In other words, at the beginning of the first sub-time period, the discharge current generator 310 may maintain the provided first current at a relatively high current value for a period of time, which may accelerate the turn-off operation of the power switch.

Figure 4A:
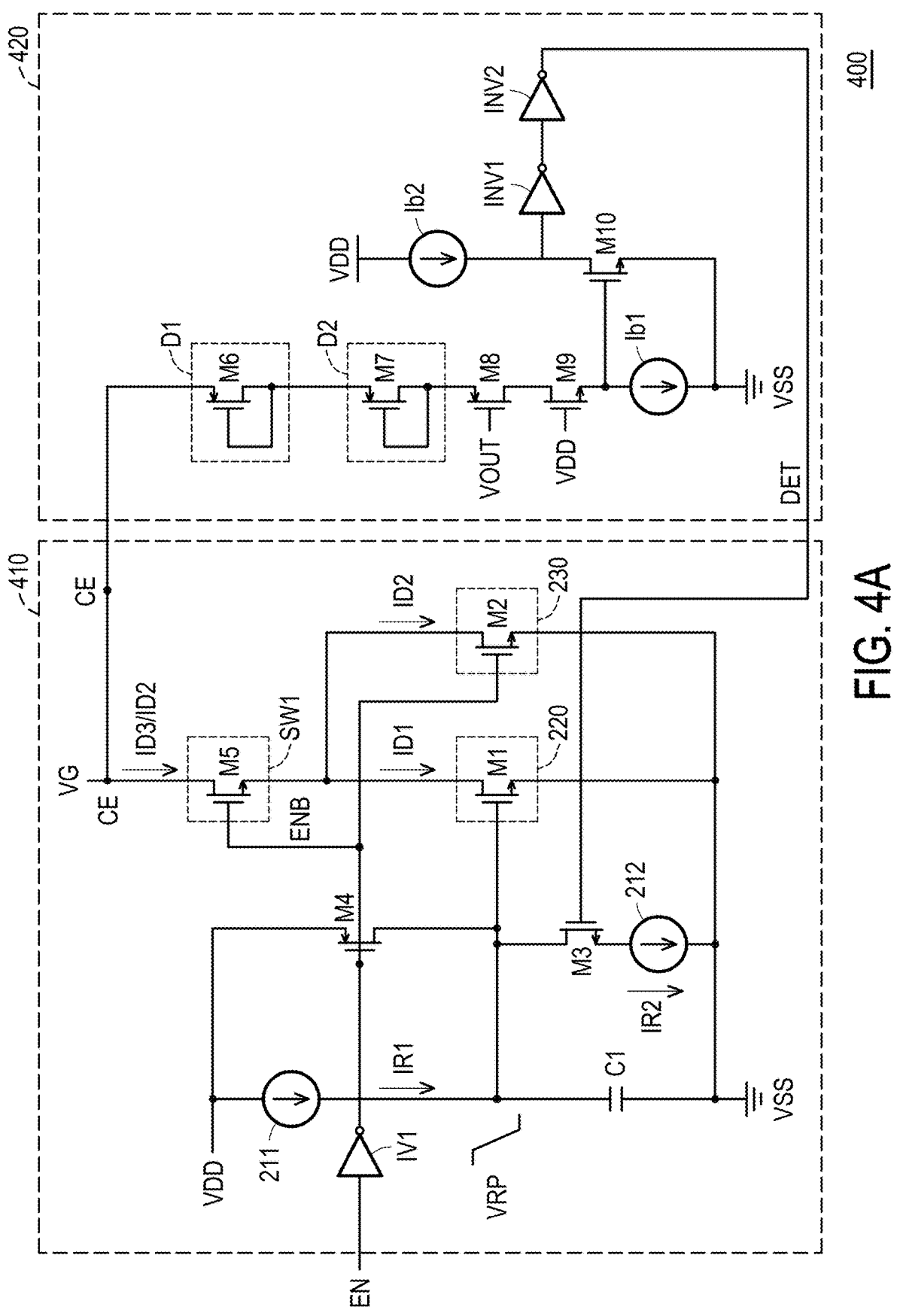
FIG. 4A is a circuit schematic diagram illustrating a control device of the power switch according to another embodiment of the disclosure.
Figure 4B:
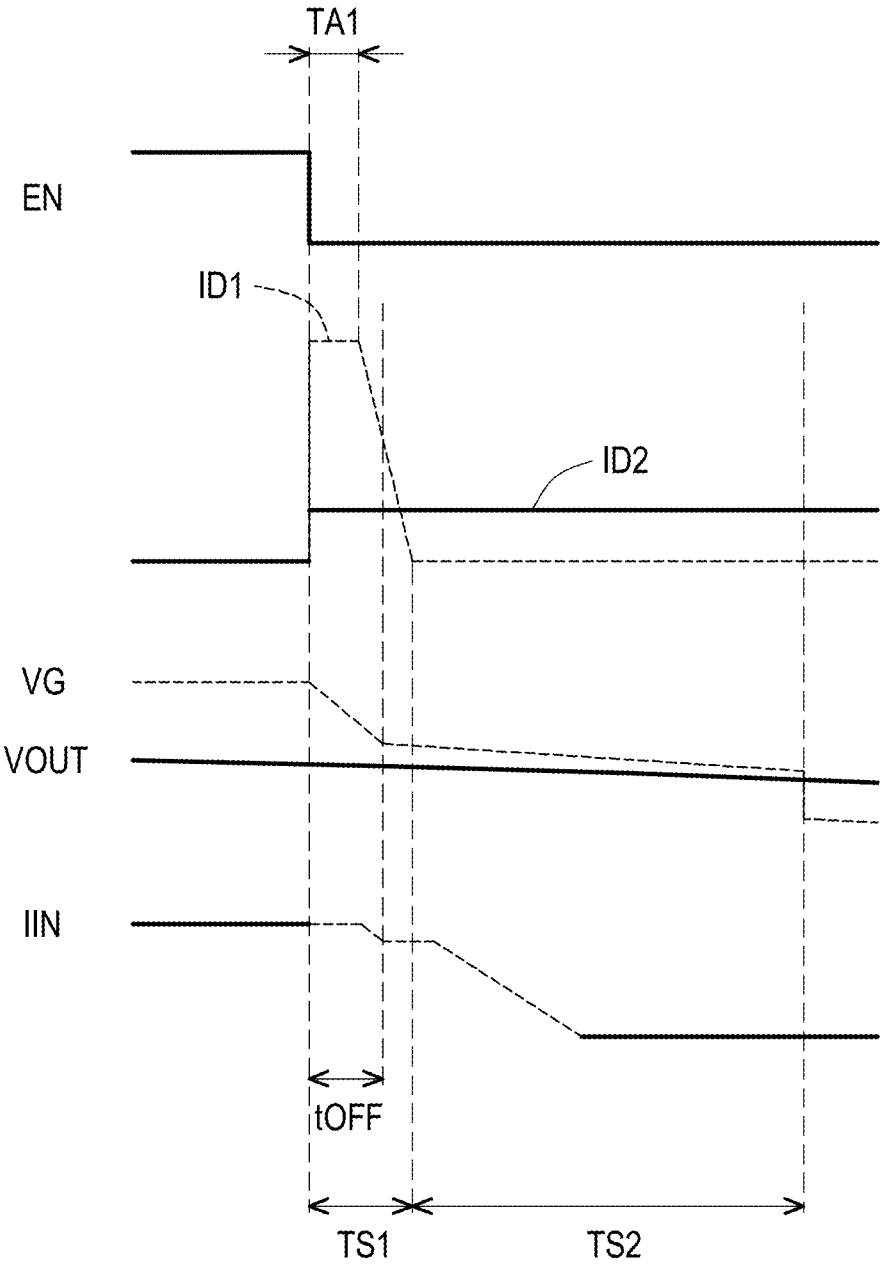
FIG. 4B is an operation waveform diagram illustrating a control device 400 according to the embodiment of FIG. 4A of the disclosure.

With reference to FIG. 4A and FIG. 4B together, FIG. 4A is a circuit schematic diagram illustrating a control device of the power switch according to another embodiment of the disclosure. FIG. 4B is an operation waveform diagram illustrating a control device 400 according to the embodiment of FIG. 4A of the disclosure. In this embodiment, the control device 400 includes a discharge current generator 410 and a comparator 420. The discharge current generator 410 has a similar circuit structure to the discharge current generator 210 in FIG. 2A, and description of the similarities therebetween is not repeated. Different from the discharge current generator 210, in this embodiment, a control end of the transistor M3 in the discharge current generator 410 receives the detection signal DET, and the detection signal DET is provided by the comparator 420.

The comparator 420 includes a plurality of diodes D1 and D2, transistors M8, M9, and M10, bias current sources Ib1 and Ib2, and inverters INV1 and INV2. The diodes D1 and D2 and the transistors M8 and M9 are connected in series sequentially, with diodes D1 and D2 being constructed by transistors M6 and M7 respectively. An anode of diode D1 is coupled to the control end CE of the power switch, while a cathode of diode D2 is coupled to the transistor M8. The transistor M9 is coupled to the bias current source Ib1. In addition, the bias current source Ib2 and the transistor M10 are connected in series between the power voltage VDD and the reference voltage VSS, with a control end of transistor M10 coupled to a mutually coupled end of the transistor M9 and the bias current source Ib1.

The inverters INV1 and INV2 are connected in series, where an input end of inverter INV1 is coupled to an output terminal of bias current source Ib2, while an output terminal of inverter INV2 generates the detection signal DET.

The series-connected diodes D1 and D2 are used to provide a bias voltage. When the control voltage VG is less than a sum of the output voltage VOUT and the bias voltage, the comparator 420 may provide the detection signal DET with a logic value of 1. By providing the detection signal DET having a logic value of 1 to the control end of the transistor M3, the transistor M3 is turned on and the ramp voltage VRP starts to decrease with time.

With reference to FIG. 4B, in a time period TA1, since the control voltage VG is not less than the sum of the output voltage VOUT and the bias voltage, the detection signal DET is at logic value 0, the ramp voltage VRP maintains a fixed relatively high voltage value, and the first current ID1 correspondingly maintains a fixed relatively high current value during the time period TA1. After the control voltage VG becomes less than the sum of the output voltage VOUT and the bias voltage, in the first sub-time period TS1 and outside the time period TA1, the ramp voltage VRP and the first current ID1 begin to gradually decrease with time. Through this mechanism, the turn-off time tOFF of the power switch may be further reduced.

Similarly, in the second sub-time period TS2, since the ramp voltage VRP has approached the reference voltage VSS, the current source 220 may stop generating the first current ID1. At this time, the discharge current generator 410 merely provides the second current ID2 through the current source 230 and sets the control end CE of the power switch to be discharged only according to the second current ID2. Under these conditions, the control voltage VG decreases slowly. The current IIN at the input end of the power switch may gradually decrease as the control voltage VG decreases, without generating the phenomenon of current surge.

It is worth mentioning that in this embodiment, the transistor M1 may first operate in a triode region and then operate in a saturation region in the first sub-time period.

Figure 5:
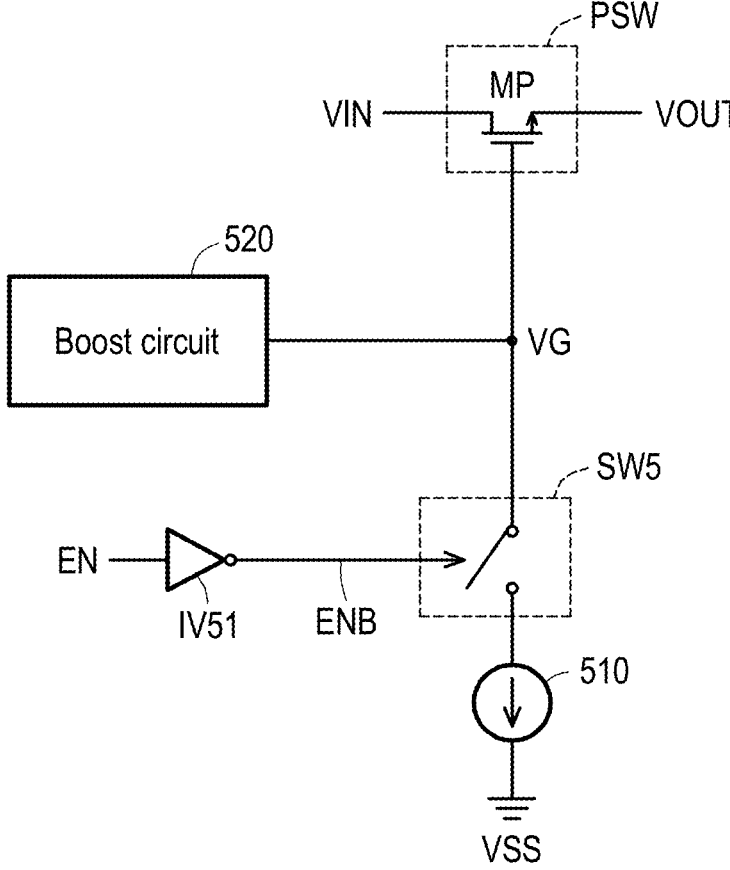
FIG. 5 is a schematic diagram illustrating a control device of the power switch according to another embodiment of the disclosure.

With reference to FIG. 5, FIG. 5 is a schematic diagram illustrating a control device of the power switch according to another embodiment of the disclosure. A control device 500 includes a discharge current generator 510, a boost circuit 520, and a switch SW5. The discharge current generator 510 and the switch SW51 are connected in series between the control end of the power switch PSW and the reference voltage VSS. The boost circuit 520 is coupled to the control end of the power switch PSW. When the control device 500 is to enable the power switch PSW to be turned on, the switch SW5 may be opened according to the inverted enable signal ENB, thereby disconnecting the discharge current generator 510 from the control end of the power switch PSW. The boost circuit 520 may enable the power switch PSW to be turned on by raising the control voltage VG. The inverted enable signal ENB is generated by the inverter IV51 based on the enable signal EN.

When the control device 500 is to turn off the power switch PSW, the switch SW5 may be turned on according to the inverted enable signal ENB, thereby connecting the discharge current generator 510 to the control end of the power switch PSW. The discharge current generator 510 may discharge the control end of the power switch PSW by generating current, thereby reducing the control voltage VG to turn off the power switch PSW. The discharge current generator 510 may be implemented using the discharge current generator 210 of the embodiment in FIG. 2A of the disclosure or it may also be implemented using the discharge current generator 410 of the embodiment in FIG. 4A of the disclosure together with the comparator 420. The relevant details have been explained thoroughly in the aforementioned embodiments and are not to be repeated herein.

In view of the foregoing, in the control device provided by the disclosure, during the procedure of turning off the power switch, different currents in multiple stages are provided to discharge the control end of the power switch, so that the control voltage is decreased in a segmented manner. In this way, the power switch may be quickly turned off in the first sub-time period. The control voltage may decrease slowly in the second sub-time period. Under the premise of not delaying the turn-off time of the power switch, the generation of voltage spikes by the input voltage is effectively reduced.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A control device of a power switch, comprising:
a discharge current generator coupled between a control end of the power switch and a reference voltage, wherein in a time period when the power switch is turned off, the discharge current generator combines a first current and a second current in a first sub-time period to generate a third current and sets the control end of the power switch to be discharged according to the third current, and the discharge current generator merely provides the second current in a second sub-time period and sets the control end of the power switch to be discharged according to the second current,
wherein the third current is greater than the second current, the first current decreases with time in the first sub-time period, and the second current is a constant current.

2. The control device according to claim 1, wherein the first current is a ramp current.

3. The control device according to claim 1, wherein the discharge current generator comprises:

a ramp voltage generator generating a ramp voltage in the first sub-time interval according to an enable signal or a detection signal;
a first current source coupled to the ramp voltage generator and the control end of the power switch and providing the first current in the first sub-time period according to the ramp voltage; and
a second current source coupled to the control end of the power switch and generating the second current in the first sub-time period and the second sub-time period according to the enable signal.

4. The control device according to claim 3, wherein the ramp voltage decreases with time in the first sub-time period.

5. The control device according to claim 3, wherein the ramp voltage generator comprises:
a third current source providing a first reference current;
a capacitor coupled to the third current source to charge the reference current; and
a fourth current source coupled to the capacitor and providing a second reference current in the first sub-time period to discharge the capacitor and set the capacitor to generate the ramp voltage.

6. The control device according to claim 5, wherein the ramp voltage generator further comprises:
a switch coupled between the fourth current source and a coupling path of the capacitor and turned on or off according to the enable signal.

7. The control device according to claim 3, wherein the first current source comprises:
a transistor coupled between the control end of the power switch and the reference voltage and generating the first current according to the ramp voltage.

8. The control device according to claim 3, wherein the second current source comprises:
a transistor coupled between the control end of the power switch and the reference voltage and generating the second current according to the enable signal.

9. The control device according to claim 3, wherein the discharge current generator further comprises:
a switch having a first end coupled to the control end of the power switch, having a second end coupled to the first current source and the second current source, and controlled by an inverted signal of the enable signal; and
a first inverter and a second inverter connected in series with each other, wherein the first inverter receives the enable signal and generates an inverted signal of the enable signal, and an output end of the second inverter is coupled to a control end of the first current source.

10. The control device according to claim 3, further comprising:
a comparator comparing a control voltage on the control end of the power switch with an output voltage of the power switch to generate the detection signal.

11. The control device according to claim 10, wherein when a voltage value of the control voltage is less than a sum of voltage values of the output voltage and a bias voltage, the comparator sets a voltage value of the ramp voltage to gradually decrease.

12. The control device according to claim 10, wherein the comparator comprises:
at least one diode having an anode end receiving the control voltage;
a first bias current source;
a first transistor and a second transistor coupled in series between a cathode end of the at least one diode and the first bias current source and respectively controlled by the output voltage and the bias voltage; and a second bias current source and a third transistor coupled in series with each other, wherein a control end of the third transistor is coupled to a mutually coupled end of the second transistor and the first bias current source, and a mutually coupled end of the second bias current source and the third transistor generates the detection voltage.

13. The control device according to claim 1, further comprising:

a boost circuit coupled to the control end of the power switch and configured to increase a voltage value of the control voltage to turn on the power switch.

14. The control device according to claim 1, further comprising:

a switch coupled between the discharge current generator and a coupling path of the control end of the power switch and turned on or turned off according to an enable signal.

\* \* \* \* \*